United States Patent [19]

Peterson

[11] Patent Number: 5,534,818
[45] Date of Patent: Jul. 9, 1996

[54] PREAMPLIFIER NOISE FILTERING CIRCUIT

[75] Inventor: Douglas R. Peterson, Minnetonka, Minn.

[73] Assignee: VTC Inc., Bloomington, Minn.

[21] Appl. No.: 417,436

[22] Filed: Apr. 5, 1995

Related U.S. Application Data

[63] Continuation of Ser. No. 175,735, Dec. 30, 1993, abandoned.

[51] Int. Cl.[6] ............................................. G05F 1/10
[52] U.S. Cl. ........................... 327/545; 327/538; 327/540
[58] Field of Search .................................. 307/246, 296.4, 307/296.6, 490, 491, 499, 520; 327/538, 540, 545, 552, 558, 560, 561, 563

[56] References Cited

U.S. PATENT DOCUMENTS

| | | | |
|---|---|---|---|
| 3,723,763 | 3/1973 | Udovic | 307/246 |
| 4,421,995 | 12/1983 | Gottschalk | 307/246 |
| 4,429,235 | 1/1984 | Minner | 307/246 |
| 4,574,202 | 3/1986 | Ogawa | 307/246 |
| 4,603,299 | 7/1986 | Monett | 307/246 |
| 4,706,138 | 11/1987 | Jove et al. | 360/67 |
| 4,866,301 | 9/1989 | Smith | 307/246 |
| 5,103,353 | 4/1992 | Jove et al. | 360/67 |
| 5,140,185 | 8/1992 | Lietar | 307/246 |
| 5,258,667 | 11/1993 | Ohtake et al. | 307/246 |
| 5,266,852 | 11/1993 | Shigenari et al. | 307/520 |

*Primary Examiner*—Terry Cunningham
*Attorney, Agent, or Firm*—Kinney & Lange

[57] ABSTRACT

A circuit for rapidly charging a capacitor for a transition between operating states is provided. A controlled reference voltage is provided to reference the circuit. A comparator compares signals at the comparator inputs and provides an output dependent upon the comparator input signals. The output of the comparator enables or disables a controlled current charging circuit. The current charging circuit rapidly charges the capacitor when enabled.

8 Claims, 2 Drawing Sheets

PREAMPLIFIER NOISE FILTERING CIRCUIT

This is a continuation of application Ser. No. 08/175,735, filed Dec. 30, 1993, now abandoned.

BACKGROUND OF THE INVENTION

The present invention relates to a preamplifier noise filtering circuit. More particularly, the present invention relates to a preamplifier circuit that permits rapid transitions between operating states thereof.

As magnetic disk drive design has evolved, track widths for data storage in the magnetic media have become narrower. As track widths have become narrower, it has become increasingly difficult to combine the media magnetization retrieval (read) and media magnetizing (write) functions in a single thin film transducer. Accordingly, disk drive designers have begun to use separate read and write transducer elements. Typically, the write element comprises a thin film transducer. The read element typically comprises a magnetoresistive (MR) sensor or head. The MR head is formed from a strip of magnetoresistive material, typically permalloy, which has a resistance which varies with the magnitude of magnetic flux passing through that strip.

An MR sensor positioned adjacent a magnetic data storage disk can be used to sense the magnetic fields associated with locally magnetized regions in the magnetic media on the disk along the tracks. Such localized regions represent data through the alternative magnetizations thereof, the sensor reading these magnetizations as the disk is rotated by it.

A known operating and sensing circuit having an MR head is illustrated in FIG. 1. The magnetoresistive head is connected across the emitters of a NPN transistor pair. A pair of high impedance resistors are each connected at an end thereof to a corresponding one of the junctions of the emitters of the transistor pair and the MR head. At the opposite ends, each of the resistors is connected to the inverting input of a corresponding high gain amplifier having its noninverting input grounded, and its output connected to the base of a corresponding one of the transistor pair to form two negative feedback loops to bias these transistors. Each of another pair of resistors is connected between a corresponding one of the collectors of the transistor pair and a voltage source. A differential input-differential output amplifier has each input thereof connected to a corresponding one of these resistors and each output connected to a corresponding one of these transistor bases to keep the voltages across these resistors substantially equal. The differential input-differential output amplifier cannot respond quickly enough to the changes in voltage across the MR head when reading disk local region magnetizations in the read state at sufficiently high frequencies to maintain the voltages across the resistors perfectly equal. Thus, magnetization changes between disk local magnetization regions will lead to decaying pulses between the operating and sensing circuit outputs representing the data stored on the disk.

The operating and sensing circuit is also used to bias the MR head. Current is drawn from the operating and sensing circuit by a current source connected to one of the emitters of the transistor pair to provide in effect the head bias current, actually drawing twice the head current in order to permit equalization of the transistor pair collector currents. Any noise generated by this current source thus appears directly across the MR head which is amplified in the same proportion as disk local region magnetization change signals, and such noise may in some situations be of a nature so similar to those signals to result in data reading errors. One possibility for eliminating the noise generated by this current source is to filter the noise in the read pass band by using a filter with a large capacitive shunting characteristic at the current source shown as a single large capacitor in FIG. 1.

However, when a transition from an operating and sensing circuit power saving (idle) state to a preamplifier retrieval readiness (read) state is desired, the delay time to charge such a filter or capacitor to thus complete a change in the circuit states would be unacceptable to many users of magnetic storage devices. The present invention provides a circuit to allow for fast idle state-to-read state transitions in an operating and sensing circuit when using a magnetoresistive head while retaining the capability of filtering out noise due to the current source required to bias the MR head.

SUMMARY OF THE INVENTION

The present invention is a capacitor charging circuit for rapidly charging a capacitive impedance such as used with a current source in a MR head operating and sensing circuit. A controlled reference voltage is provided to supply a reference voltage to the circuit. A comparator is provided to compare the reference voltage and the capacitor voltage, and to provide an output based on this comparison. The output of the comparator enables or disables a controlled current charging circuit. The current charging circuit rapidly charges the capacitor when enabled. Once the capacitor is sufficiently charged, the comparator changes states, thus disabling the current charging circuit.

DETAILED DESCRIPTION OF THE PREFERRED EMBODIMENTS

Figure 2:
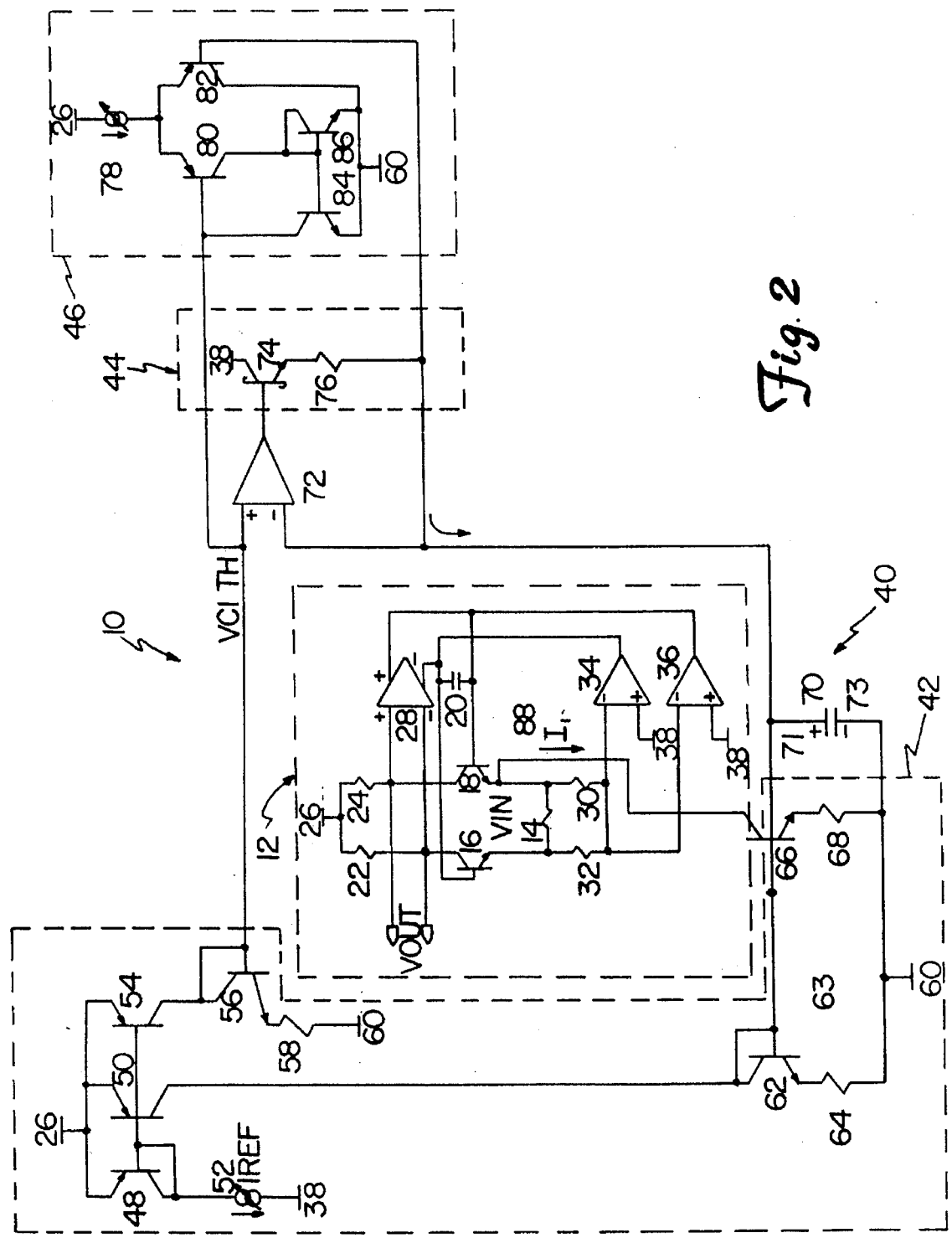
FIG. 2 is a circuit diagram of a preamplifier embodying the present invention.

FIG. 2 illustrates a preamplifier circuit 10 containing the capacitor charging circuit of the present invention. A magnetoresistive (MR) head operating and output sensing circuit is shown enclosed within a dashed box 12. Circuit 12 has a magnetoresistive head 14 connected between inputs thereto, the inputs being the emitters of a pair of NPN bipolar transistors 16 and 18. A capacitor 20 is connected between the bases of transistors 16 and 18. Resistors 22 and 24 are each connected to one of the collectors of transistors 16 and 18, respectfully, and are equal in value. A terminal 26 suitable for connection to a source of positive voltage is connected to resistors 22 and 24.

A high gain amplifier 28 with high impedance inputs and outputs has its noninverting input (with respect to the plus sign marked output) connected to the junction of resistor 24 and the collector of transistor 18, and has its inverting input connected to the junction of resistor 22 and the collector of transistor 16. The positive marked differential output of amplifier 28 is connected to the base of transistor 18, and the negative marked differential output of amplifier 28 is connected to the base of transistor 16. Two further resistors 30 and 32 are each connected to opposite ends of MR head 14 with the opposite ends of resistors 30 and 32 being connected together. Two further amplifiers 34 and 36 are each connected to the joined ends of resistors 30 and 32 at the inverting inputs thereof. The amplifiers 34 and 36 are differential high gain amplifiers having high impedance inputs and outputs. The noninverting inputs of amplifiers 34 and 36 are each connected to a ground reference terminal 38. The outputs of amplifiers 34 and 36 are each connected to a corresponding one of the bases of transistors 16 and 18, respectively. The MR head 14 and its associated circuitry act as a load to the preamplifier circuit 10.

Much of the remaining portion of circuit 10 comprises a charging circuit 40. Charging circuit 40 contains a voltage matching circuitry portion shown in a dashed line box 42, a controlled current charging means circuitry portion shown in a dashed line box 44, and a modifying means circuitry portion shown in a dashed line box 46.

A pair of PNP bipolar transistors 48 and 50 form a current mirror as part of voltage matching circuitry 42. A controlled current source 52 is connected to, and draws current from the common juncture of the base of a PNP bipolar transistor 50 and the collector and base of a PNP bipolar transistor 48 to pass the current drawn to ground terminal 38. The emitters of transistors 48 and 50 are both connected to supply voltage terminal 26. A PNP bipolar transistor 54 has its emitter connected to supply voltage terminal 26 and its base connected to the bases of transistors 48 and 50. A diode-connected NPN bipolar transistor 56 is provided with its collector connected to its base and to the collector of transistor 54. A resistor 58 is connected between the emitter of transistor 56 and a terminal 60 suitable for connection to a negative supply voltage.

A diode-connected NPN transistor 62 is provided with its collector connected to its base and to the collector of transistor 50. A resistor 64 is connected between the emitter of transistor 62 and negative supply voltage terminal 60. A NPN bipolar transistor 66 is provided connected at its base to the base of transistor 62. A resistor 68 is provided connected between the emitter of transistor 66 and negative supply voltage terminal 60. The collector of transistor 66 is connected to the emitter of transistor 18 in circuit portion 12, and to both the MR head 14 and resistor 30. Thus, transistors 62 and 66, and resistors 64 and 68, in conjunction with transistors 48 and 50, under the control of current source 52 serve as the current source in FIG. 1.

Figure 1:
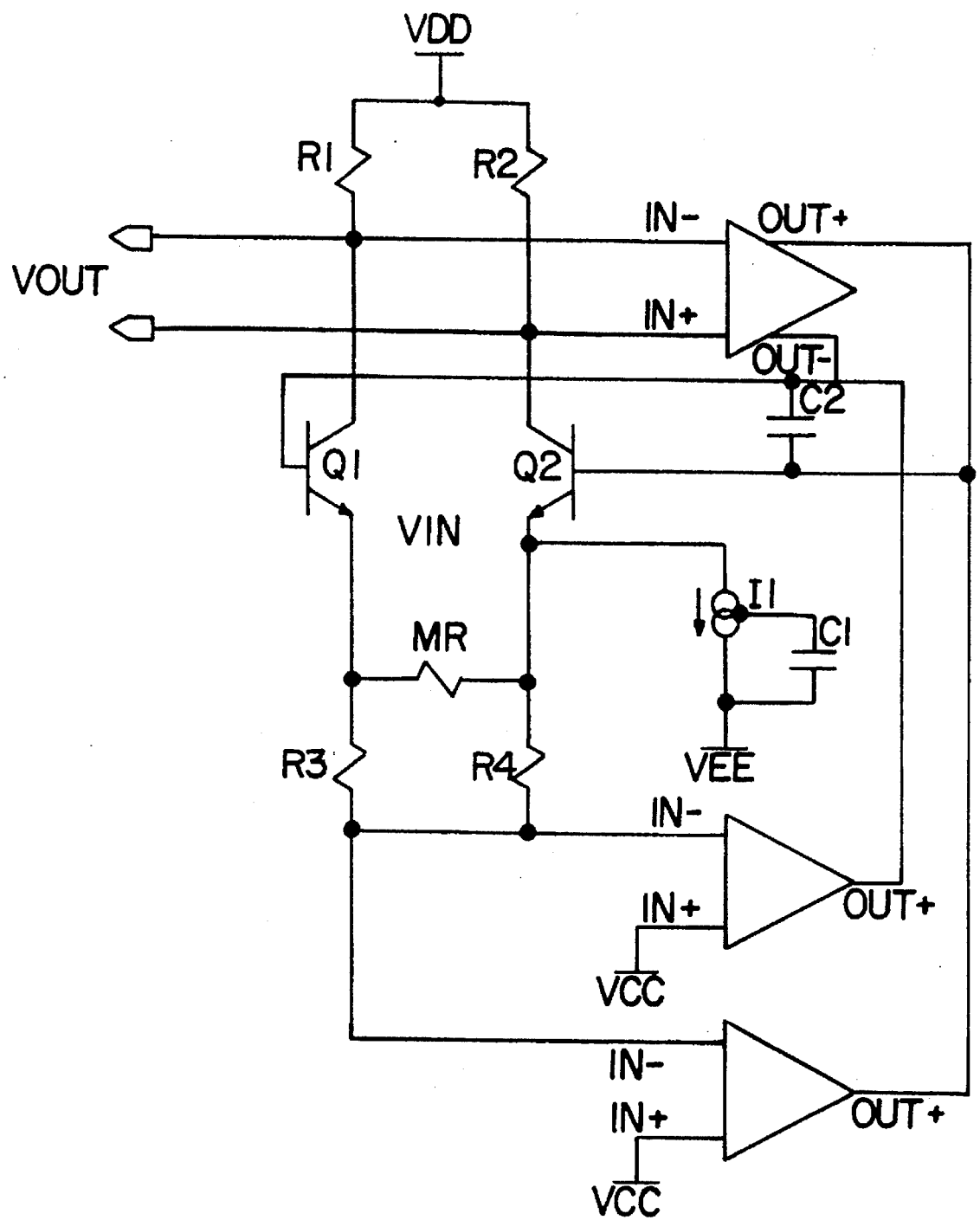
FIG. 1 is a circuit diagram of a prior art operating and sensing circuit for a magnetoresistive head.

A large capacitance value capacitor 70 is provided having a positive terminal 71 connected to the base of transistor 66 and a negative terminal 73 connected to the negative supply voltage terminal 60 and serves as the capacitive filter of FIG. 1. A comparator 72 has its noninverting input connected to the base of transistor 56, and its inverting input connected to the positive terminal 71 of capacitor 70 and the base of transistor 66. The output of comparator 72 is connected to the limited current charging means 44.

Controlled current charging means 44 has a NPN bipolar transistor 74 with its base connected to the output of comparator 72 and its collector connected to ground terminal 38. A current limiting resistor 76 is connected between the emitter of transistor 74 and the positive terminal 71 of capacitor 70 and the base of transistor 66.

Modifying means 46 has a controlled current source 78 connected to draw current from supply voltage terminal 26. A pair of PNP bipolar transistors 80 and 82 are provided connected at the emitters thereof to draw current from a current source 78. A NPN bipolar transistor 84 has its base connected to the collector of transistor 80, its collector connected to the base of transistor 80, to form a regenerative feedback pair, and has its emitter connected to the negative supply voltage terminal 60. A diode-connected NPN bipolar transistor 86 has its base connected to its collector and to the base of transistor 84, and its emitter is connected to negative supply voltage terminal 60.

In operation, circuit 12 provides a current bias to MR head 14. A substantially constant voltage is generated across resistors 22 and 24, and thus at $V_{OUT}$, by amplifiers 34, 36 and 28 and operating transistors 16 and 18. Resistors 22 and 24 typically have resistance values of 200 Ω. Initially, however, when in the idle state, circuit 12 is off because no current is drawn by sources 52 and 78 and because amplifiers 28, 34, 36 and 72 are not energized. There then is no current in the base of transistor 66 serving as the bias current source for cicuit 12 and thus no current is being drawn from circuit 12 at the emitter of transistor 18.

Upon switching to the read state,, through current source 52 being switched on, current 88 is drawn from circuit 12 by transistor 66, and thus current is flowing through transistor 18. Amplifiers 28, 34, 36 and 72 are energized contemporaneously with the switching on of source 52 and source 78. The drawing of current 88 lowers the voltage at the noninverting input of amplifier 28 to being below the voltage at the inverting input thereof, causing the plus marked output of amplifier 28 to go to a lower voltage and the minus marked output to go to a higher voltage. Because the minus marked output of amplifier 28 is high, transistor 16 turns on. With transistor 16 on, current is drawn through transistor 16 thus lowering the voltage at the inverting input of amplifier 28. In order to equalize the voltages across equal resistors 22 and 24, the currents through them must be equal. For the currents through resistors 22 and 24 to be equal, the collector currents of transistors 16 and 18 must be equal. Amplifier 28 continues to change output voltages in response to relative input changes in tending toward providing constant and equal voltages across resistors 22 and 24 at the circuit 12 outputs.

The function of amplifiers 34 and 36 is to operate MR head 14 near the potential of the magnetic disc, which is grounded, while permitting the desired bias current therein. This head potential is necessary because a voltage of greater than a few hundred millivolts will ionize the atmosphere between MR head 14 and the disc, and the resulting arc could damage the head and corrupt data. Resistors 30 and 32 are large relative to the MR head 14 resistance so that they don't draw substantial current. In the preferred embodiment, the head has a nominal resistance of 5 to 30 Ω, while resistors 30 and 32 are in the range of 80 K Ω and are substantially equal in resistance. The voltage appearing at the inverting input terminals of amplifiers 34 and 36 is equal to the voltage at the center point of the 14. The output signals of amplifiers 34 and 36 are fed back to corresponding ones of the bases of transistors 16 and 18 to force the center point potential of MR head 14 to essentially ground.

Current 88 drawn from circuit 12 by the collector of transistor 66 provides in effect the head bias current. Current 88 is drawn by a current mirror 63 formed by transistors 62 and 66 and resistors 64 and 68 which typically have resistance values of 500 Ω and 50 Ω respectively. Noise is generated by current mirror 63 providing current 88 primarily in the form of shot noise from transistor 66 and thermal noise from resistor 68. The noise from resistor 68 and transistor 66 combine to form a current source with significant noise that dominates other noise sources in circuit 12. The noise generated by current 88 appears directly across MR head 14 to thus be amplified in the same proportion as the input signal developed thereacross by sensing disk regions magnetizations. To eliminate the noise generated by current 88, a large capacitor 70 for filtering such noise in the reader pass band is necessary, or some other mainly capacitive filter arrangement.

In the preferred embodiment, a 5 V supply is connected to terminal 26 and a −4.5 V supply is connected to terminal 60. Capacitor 70 is charged to 2.5 V in the read mode, thus leaving capacitor 70's positive terminal 71 at −2 V relative to ground. In order to save power in the idle mode, capacitor 70 is discharged. The idle-to-read delay is desired to be no greater than 5 μs. To accomplish this, capacitor 70, which in the preferred embodiment has a capacitance value of 0.1 μF, requires a current of 50 mA to charge to 2.5 V within 5 μs as determined from the well known relationship characterizing a capacitor i=C(dv/dt). A charging circuit must be able to generate this current quickly when the read mode is selected, and must be able to sense the capacitor voltage and shut off the current to the capacitor when the capacitor is fully charged to its read mode operating point, before overcharging capacitor 70.

In capacitor charging circuitry portion 40, current 88 is a function of the reference current from controlled source 52. Transistors 48 and 50 form a 1:2 current mirror with the collector current of transistor 50 being applied to current mirror 63, and the collector current of transistor 50 being twice the magnitude of controlled current source 52 through having an emittier area that is twice that of transistor 48. Current mirror 63 is a 1:10 current mirror in order to provide the necessary current through bias head 14 by having the emitter area of transistor 66 being 10 times that of transistor 62 and the resistance of resistor 64 being 10 times the resistance of resistors 68. In this configuration, the current in the collector of transistor 66 is ten times the current in the collector of transistor 62. As mentioned, the collector current of transistor 66 draws bias current 88 from circuit 12.

In the idle mode, current source 52 is switched off, circuit 12 is inoperable because amplifiers 28, 34, 36 and 72 are not energized, controlled current 78 is switched off, and capacitor 70 is discharged. When the read mode is selected, current source 52 is switched on and the collector current of transistor 50 begins to charge capacitor 70. The current on the collector of transistor 50 is not of a magnitude to charge capacitor 70 rapidly enough to meet the 5μs idle-to-read transition time desired, and thus, additional charging circuitry is necessary. Transistor 54 is matched to transistor 50 and transistor 56 is matched to transistor 62. Resistor 58, typically 475 Ω, is nearly matched to resistor 64, typically 500 Ω, with resistor 58 being slightly less than the resistor 64 so that as the capacitor charges to its operating value, the voltage at the base of transistor 56 is slightly less than the read mode operating voltage at positive terminal 71 of capacitor 70. The voltage at the positive input of comparator 72 is called the threshold voltage (VC1TH).

Additional current to rapidly charge capacitor 70 is provided by controlled current charging means circuitry portion 44. Initially, the output of amplifier 72 is high, thus saturating transistor 74. By driving transistor 74 into saturation, the emitter of transistor 74 is essentially tied to terminal 38. The charging current applied to capacitor 70 is limited by the voltage across resistor 76 in current charging means circuitry portion 44. When the voltage across capacitor 70 exceeds the voltage VC1TH, the output of amplifier 72 reverses polarity and goes low shutting off transistor 74. With transistor 74 off, no more charging current from controlled current charging means circuitry portion 44 is sent to capacitor 70.

Charging circuitry portion 40 contains some hysteresis embodied in modifying means circuitry portion 46 which modifies the voltage at the noninverting input of amplifier 72 to prevent amplifier 72 from jittering between output polarities due to insignificant input changes such as due to capacitor leakage, noise, etc. Initially, before and for a while after switching current source 52 on, the voltage at the base of transistor 82 is less than that at the base of transistor 80. Since these transistors are PNP transistors, the current from source 78 flows through transistor 82 to terminal 60. When the voltage at capacitor 70 due to its being charged as described above exceeds the threshold voltage, transistor 80 turns on and the current from source 78 flows through transistor 80. The current flowing through transistor 80 is mirrored through transistors 84 and 86. Transistor 84 is turned on which diverts some of the collector current from transistor 54 away from the noninverting input of amplifier 72. Thus, the voltage at the base of transistor 56 is pulled well below the threshold voltage value VC1TH and the operating voltage across capacitor 70, insuring that amplifier 72 remains off until another idle to read transition occurs.

Although the present invention has been described with reference to preferred embodiments, workers skilled in the art will recognize that changes may be made in form and detail without departing from the spirit and scope of the invention.

What is claimed is:

1. A circuit for rapidly charging a capacitor means, the circuit comprising:

signal generating means for generating a first and a second signal, the second signal having a predetermined relationship to the first signal, the signal generating means electrically connected to the capacitor means to provide the second signal to the capacitor means;

comparator means having a first and a second input and an output for comparing signals, the first input electrically connected to the signal generating means for receiving the first signal of the signal generating means and the second input electrically connected to the capacitor means; and controlled current charging means electrically connected to the output of the comparator means for controlling the current provided by the charging means, the controlled current charging means having an output electrically connected to the capacitor means; and modifying means electrically connected to the capacitor means and the first input of the comparator means for modifying a voltage at the first input of the comparator means when a voltage across the capacitor means exceeds the voltage at the first input of the comparator means to insure that the comparator means does not accidentally change output polarities.

2. The circuit of claim 1 wherein the modifying means further comprises a current source coupled to an emitter of a first transistor and coupled to an emitter of a second transistor, a base of the first transistor electrically connected to the first input of the comparator means and a base of the second transistor electrically connected to the capacitor means, a third transistor diode-connected having a base of the third transistor electrically connected to a collector of the third transistor and electrically connected to a collector of the first transistor, an emitter of the third transistor electrically connected to a collector of the second transistor, a fourth transistor having a base electrically connected to the base of the diode-connected transistor and having an emitter electrically connected to the emitter of the diode-connected transistor, a collector of the fourth transistor electrically connected to the first input of the comparator means, and a negative supply terminal electrically connected to the emitters of the diode-connected transistor and the fourth transistor.

3. The circuit of claim 1 wherein the controlled current charging means further comprises a resistor and a transistor having a base, a collector and an emitter, the base of the transistor electrically connected to the output of the comparator means, the collector of the transistor electrically connected to a ground terminal and the resistor electrically connected between the emitter of the transistor and the capacitor means, the capacitor means electrically connected to a negative supply source.

4. The circuit of claim 1 wherein when the capacitor means achieves a preset percentage of a fully charged value when the output of the comparator means changes polarity, wherein the controlled current charging means stops charging the capacitor means and the second signal of the signal generating means continues to charge the capacitor means toward the fully charged value.

5. A circuit for rapidly charging a capacitor means which transitions between operating states in a read/write preamplifier with a magnetoresistive head, the circuit comprising:

signal generating means for generating a first and a second signal, the second signal having a predetermined relationship to the first signal, the signal generating means electrically connected to the capacitor means to provide the second signal to the capacitor means, the second signal providing current to a load comprising the magnetoresistive head, a transistor pair, and a plurality of feedback loops;

comparator means having a first and a second input and an output for comparing signals, the first input electrically connected to the signal generating means for receiving the first signal of the signal generating means and the second input electrically connected to a junction of the capacitor means and the signal generating means;

controlled current charging means electrically connected to the output of the comparator means for controlling a current provided by the charging means, the controlled current charging means having an output electrically connected to the capacitor means; and modifying means electrically connected to the capacitor means and the first input of the comparator means for modifying a voltage at the first input of the comparator means when a voltage across the capacitor means exceeds the voltage at the first input of the comparator means to insure that the comparator means does not accidentally change output polarities.

6. The circuit of claim 5 wherein the modifying means further comprises a current source coupled to an emitter of a first transistor and coupled to an emitter of a second transistor, a base of the first transistor electrically connected to the first input of the comparator means and a base of the second transistor electrically connected to the capacitor means, a third transistor diode-connected having a base of the third transistor electrically connected to a collector of the third transistor and electrically connected to a collector of the first transistor, an emitter of the third transistor electrically connected to a collector of the second transistor, a fourth transistor having a base electrically connected to the base of the diode-connected transistor and having an emitter electrically connected to the emitter of the diode-connected transistor, a collector of the fourth transistor electrically connected to the first input of the comparator means, and a negative supply terminal electrically connected to the emitters of the diode-connected transistor and the fourth transistor.

7. The circuit of claim 5 wherein the controlled current charging means further comprises a resistor and a transistor having a base, a collector and an emitter, the base of the transistor electrically connected to the output of the comparator means, the collector of the transistor electrically connected to a ground terminal and the resistor electrically connected between the emitter of the transistor and the capacitor means, the capacitor means electrically connected to a negative supply source.

8. The circuit of claim 5 wherein when the capacitor means achieves a preset percentage of a fully charged value when the output of the comparator means changes polarity, wherein the controlled current charging means stops charging the capacitor means and the second signal of the signal generator means continues to charge the capacitor means toward the fully charged value.

\* \* \* \* \*